United States Patent [19]

Takemura et al.

[11] Patent Number: 4,954,870
[45] Date of Patent: Sep. 4, 1990

[54] SEMICONDUCTOR DEVICE

[75] Inventors: Momoko Takemura, Tokyo; Michihiko Inaba, Yokohama; Toshio Tetsuya, Hyogo; Mitsuo Kobayashi, Aioi, all of Japan

[73] Assignee: Kabushiki Kaisha Toshiba, Kawasaki, Japan

[21] Appl. No.: 804,617

[22] Filed: Dec. 5, 1985

[30] Foreign Application Priority Data

Dec. 28, 1984 [JP] Japan .................................. 59-276075
Dec. 28, 1984 [JP] Japan .................................. 59-276077
Dec. 28, 1984 [JP] Japan .................................. 59-276104

[51] Int. Cl.$^5$ ...................... H01L 23/54; H01L 23/48
[52] U.S. Cl. .......................................... 357/67; 357/71
[58] Field of Search ...................... 357/63, 67, 71, 23.9

[56] References Cited

U.S. PATENT DOCUMENTS

| | | | |
|---|---|---|---|
| 3,679,492 | 7/1972 | Fang et al. | 357/23.9 |
| 3,706,015 | 12/1972 | Schimmer et al. | 357/67 |
| 4,005,454 | 1/1977 | Froloff et al. | 357/65 |

FOREIGN PATENT DOCUMENTS

| | | | |
|---|---|---|---|
| 0859342 | 12/1970 | Canada | 357/71 |
| 85109419 | 9/1986 | China . | |
| 0070435 | 1/1983 | European Pat. Off. . | |
| 1639366 | 10/1975 | Fed. Rep. of Germany . | |
| 3312713 | 11/1984 | Fed. Rep. of Germany . | |
| 5575226 | 12/1978 | Japan . | |
| 0015432 | 1/1982 | Japan | 357/71 |
| 59-193036 | 4/1983 | Japan . | |
| 2138633 | 10/1984 | United Kingdom . | |
| 8202457 | 7/1982 | World Int. Prop. O. . | |

*Primary Examiner*—Rolf Hille
*Assistant Examiner*—S. V. Clark
*Attorney, Agent, or Firm*—Oblon, Spivak, McClelland, Maier & Neustadt

[57] ABSTRACT

Semiconductor device in which a semiconductor chip is fixed to a lead frame by Sn-Cu alloy solder with a first metal layer interposed between the chip and the solder. The first metal layer is formed at a thickness ranging from 2000 Å to 3 μm, and made of a metal selected from Ti, Cr, V, Zr, Nb and an alloy containing at least one of these metals. A second metal layer made of Ni, Co or an alloy containing at least one of these metals may be interposed at a thickness smaller than that of the first metal between the first metal layer and the solder.

14 Claims, 4 Drawing Sheets

F I G. 4
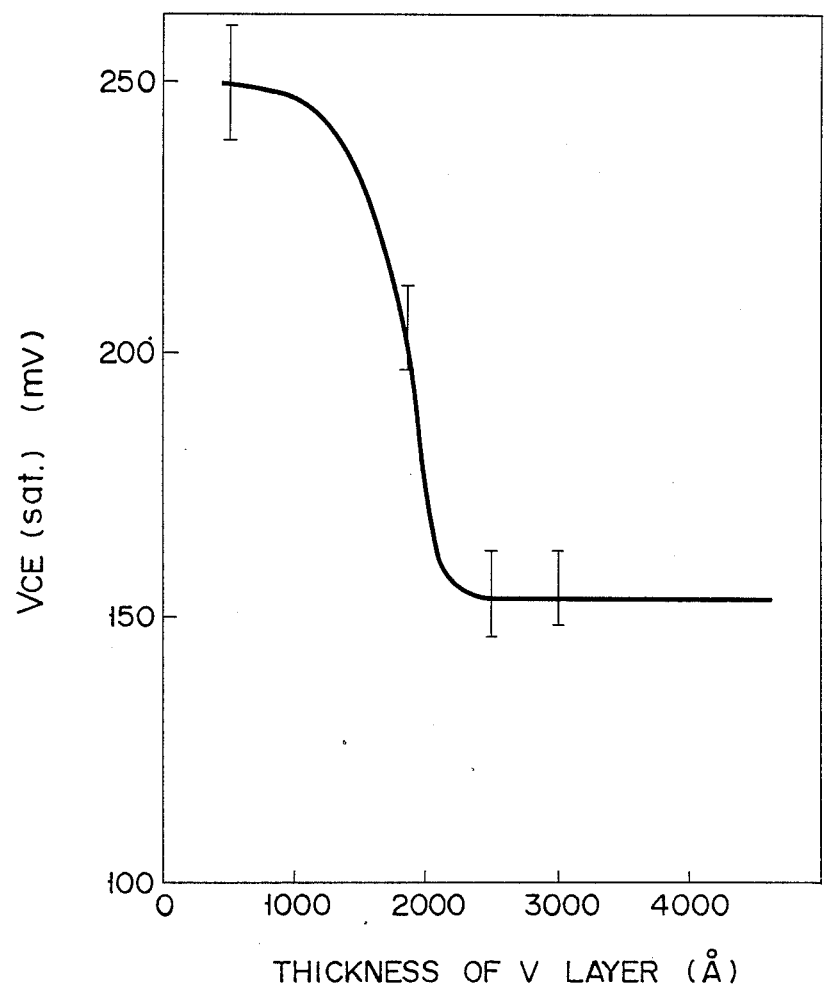

1

SEMICONDUCTOR DEVICE

Background of the Invention (a) Field of the Invention

The present invention relates to a semiconductor device and, more particularly, to an improvement in the bonding layer when a semiconductor chip is fixed to a base such as a lead frame.

(b) Description of the Prior Art

As is conventionally known, when a semiconductor element chip is fixed on a lead frame or the like, a vanadium (V) layer is deposited on the bottom surface of the chip in advance, and then a nickel (Ni) layer is deposited thereon. Thereafter, the Ni layer and the lead frame are bonded to each other by a solder material made of a gold-germanium (Au-Ge) alloy (Japanese Patent Disclosures No. 55-19805 and No. 55-19806).

However, this structure has the following drawbacks. First, when the chip is bonded to the lead frame, if it is heated to 320° C. or higher, the Ni layer reacts with silicon (Si) contained in the chip, and nickel silicide is easily formed. Although the V layer is interposed between the Ni layer and Si of the element chip, the bottom surface of the element chip is not flat and is normally roughened on the order of several microns so as to improve a bonding property with respect to the bonding layer. In addition, the thickness of the V layer varies, and when heated, Ni is easily diffused to the bottom surface of the element chip. The nickel silicide itself is fragile, and undergoes a considerable volume variation due to a change in density during its formation process. Therefore, a large number of pores are formed, thus causing degradation in reliability such as poor contact, scaling, peeling and the like. Second, when the semiconductor device is used, e.g., in an atmosphere of high humidity, a local cell is formed between the Ni layer and the Au-Ge alloy layer, and as a result, electrical characteristics of the semiconductor device may be degraded or the chip may be displaced from the base. Third, since the solder material comprises gold as its major component, it is expensive and increases the cost of the semiconductor device.

Meanwhile, another structure is known wherein a V layer is deposited on the bottom surface of a semiconductor element chip, an Ni layer is deposited thereon, and the Ni layer is bonded to a lead frame using a solder material made of a tin-copper (Sn-Cu) alloy (Japanese Patent Disclosure No. 59-193036).

With this structure, the above-mentioned local cell is not formed, and cost is low as compared to the former device. However, in soldering, electrical characteristics such as $V_{CE}$ (Collector-Emitter Voltage) Saturation in an npn transistor are degraded due to diffusion of Cu to the semiconductor element chip. It is considered to be attributed to the fact that mutual diffusion of Ni and Cu occurs near 400° C. regardless of the small diffusion coefficients of Cu in Ni, and the Ni layer does not serve as a sufficient barrier against Cu diffusion. Conventionally, an Ni layer was considered as a barrier against Cu diffusion. However, it was found that an Ni layer does not effectively serve as a barrier in practice. The V layer interposed between the Ni layer and the element chip in the above structure has a thickness of about 200 to 1,000 Å for improving the bonding property, but it is not sufficient as a barrier against Cu diffusion.

SUMMARY OF THE INVENTION

It is an object of the present invention to provide a semiconductor device in which a semiconductor chip is fixed to a base such as a lead frame through a bonding layer, wherein poor contact or peeling of the bonding layer does not easily occur, cost of the bonding layer can be decreased, and the electrical characteristics of the semiconductor element will not be adversely influenced by the bonding layer.

According to the present invention, there is provided a semiconductor device in which a semiconductor chip is fixed to a base by a solder material layer consisting of a tin-copper alloy, wherein a first metal layer consisting of a metal selected from the group consisting of titanium, chromium, vanadium, zirconium and niobium or an alloy containing not less than 75 atomic % of at least one of the metals and having a thickness falling within the range between 2,000 Å and 3 μm is interposed between the solder material layer and the semiconductor chip.

Furthermore, according to the present invention, there is provided a semiconductor device wherein a second metal layer consisting of a metal selected from the group consisting of nickel and cobalt or an alloy containing not less than 75 atomic % of at least one of the metals and having a thickness smaller than that of the first metal layer is interposed between the first metal layer and the solder material layer.

BRIEF DESCRIPTION OF THE DRAWINGS

FIG. 4 is a graph for explaining characteristics of the semiconductor device according to the present invention;

DESCRIPTION OF THE PREFERRED EMBODIMENTS

An embodiment of the present invention will be described with reference to the accompanying drawings.

Figure 1:
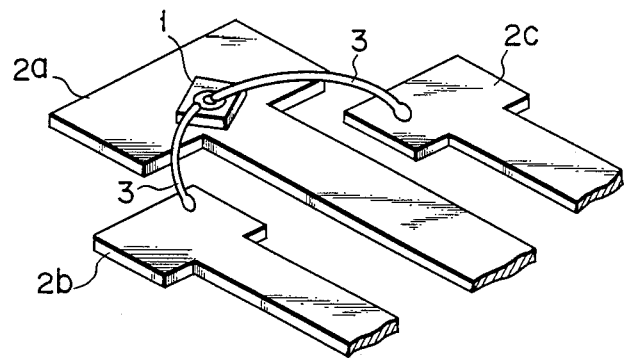
FIG. 1 is a perspective view showing a state wherein a semiconductor chip is bonded to a lead frame.

FIG. 1 shows a state wherein a semiconductor chip, e.g., is bonded to a lead frame. Referring to FIG. 1, reference numeral 1 denotes a semiconductor chip; and 2a, 2b and 2c; lead frames. The chip 1 is connected to the lead frames 2b and 2c through bonding wires 3.

Figure 2:
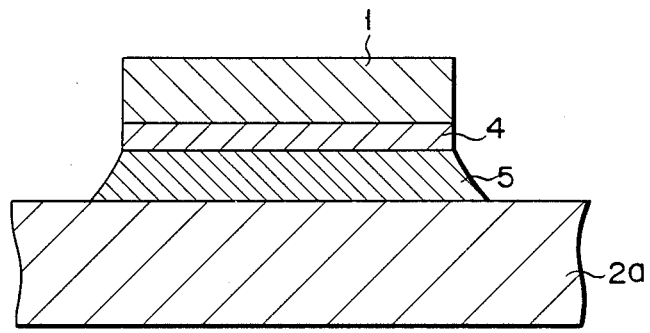
FIG. 2 is a sectional view showing an arrangement of a semiconductor device according to an embodiment of the present invention.

As shown in FIG. 2, a first metal layer 4 is deposited on the back surface of the chip 1, and a solder material layer 5 is deposited thereon. The chip 1 is disposed on and fixed to the lead frame 2a through the layer 5.

For the first metal layer 4, a metal selected from the group consisting of titanium (Ti), chromium (Cr), vanadium (V), zirconium (Zr) and niobium (Nb) or an alloy containing 75 atomic % or more of at least one of these metals is used. The thickness of the layer 4 is set to be 2,000 Å to 3 μm and preferably 2,300 Å to 1 μm. When the thickness of the layer 4 is below 2,000 Å, the preventive effect of Cu diffusion in the solder material may become insufficient. Although there is no problem if the thickness of the layer 4 is set to be larger than 3 μm, it is undesirable in view of manufacturing time and cost.

The metal layer 4 is not limited to a single layer as shown in FIG. 2, but can be a multilayer in which two or more metal layers consisting of two or more metals selected from the group consisting of Ti, Cr, V, Zr and Nb are stacked. This also applies when an alloy of these metals is used. When two or more layers are stacked, a total thickness of the layer 4 preferably falls within the range between 2,000 Å and 3 μm. Among Ti, Cr, V, Zr and Nb, preferable metals to be interposed as a barrier layer (the first metal layer) between the layer 5 and the chip 1 are Ti, Cr and V. This is because Zr and Nb require a deposition temperature of 2,400° C. or higher and do not allow easy control of deposition conditions.

Furthermore, about 20 atom. % of phosphorus (P) or boron (B) can be added to the layer 4 so as to further improve the barrier effect.

The solder material layer 5 preferably consists of a tin-copper (Sn-Cu) alloy, and more preferably contains 13.3 to 75 atomic %, preferably 30 to 75 atomic %, most preferably 50 to 65 atomic % of Cu. Sn and Cu forming the layer 5 have substantially the same melting point (for example, Sn: 1,685° K., Cu: 1,690° K. at 0.1 Torr). Therefore, the following advantages can be provided: a deposited Sn-Cu alloy composition can be the same as the deposition source composition, the Sn-Cu alloy is melted at relatively low temperatures (e.g., in the case of Sn(38 to 92.4 wt %)-Cu, the melting point is 415° C.), and the Sn-Cu alloy is inexpensive as compared to an Au-Ge alloy.

The layer 5 can contain 53 atomic % or less of zinc (Zn) based upon the content of copper, or can contain 25 atomic % or less of aluminum (Al) based thereupon. When Zn or Al is added, thermal and electrical conductivity coefficients are increased, and electrical characteristics and reliability of the semiconductor device can be improved. The thickness of the layer 5 is normally set to be 1 μm to 3 μm.

Note that a gold (Au) layer having a thickness of 1,500 to 3,000 Å can be formed on the surface of the layer 5 so as to prevent oxidation.

Figure 3:
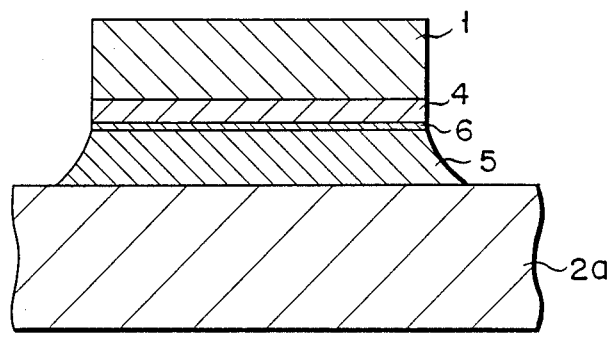
FIG. 3 is a sectional view showing an arrangement of a semiconductor device according to another embodiment of the present invention.

FIG. 3 shows a modification of a semiconductor device according to the present invention. A sole difference between this modification and the embodiment shown in FIG. 2 is that a second metal layer 6 as a thermal shock absorbing layer is interposed between the first metal layer 4 and the solder material layer 6.

For the second metal layer 6, a metal selected from the group consisting of nickel and cobalt or an alloy containing 75 atomic % or more of at least one of these metals is used. The layer 6 has a thermal expansion coefficient between those of the layers 4 and 5 so as to absorb internal strain upon application of a thermal shock.

Furthermore, about 20 atom. % of P or B can be added to the layer 6 so as to improve the barrier effect as in the case of the layer 4. The thickness of the layer 6 is preferably set to be smaller than that of the layer 4. A high thermal shock resistance can be obtained by decreasing the thickness of the layer 6 below that of the Ni layer in the conventional structure comprising a V layer, an Ni layer and an Sn-Cu alloy layer due to the following facts. Ni and Cu form an alloy of all proportional solid solution type, and during soldering, Cu is diffused in Ni, and in an extreme case, pores are formed in Sn-Cu layer 5, thus degrading the mechanical strength. However, when the thickness of the Ni layer is decreased, the diffusion amount of Cu can be decreased.

When the layer 4 is formed thicker than the layer 6, Cu diffusion from the layer 5 to the chip 1 can be effectively prevented, thereby suppressing degradation in electrical characteristics.

Since the other arrangement of the embodiment shown in FIG. 3 is the same as that of FIG. 2, the same reference numerals in FIG. 3 denote the same parts as in FIG. 2, and a detailed description thereof is omitted.

The present invention will be described hereinafter by way of examples.

EXAMPLES 1 and 2

Referring first to FIG. 2, an npn small-signal transistor is used as the semiconductor element chip 1. In Example 1, a 3,000 Å thick V layer as the first metal layer 4 was deposited on the back surface of a chip 1, and a 1.5 μm thick Sn-Cu alloy layer (Cu: 50 atomic %) was deposited thereon. In Example 2, a 2,600 Å thick V layer as the layer 4 and a 2.1 μm thick Sn-Cu alloy layer (Cu: 50 atomic %) were sequentially deposited on the back surface of another chip 1. Then, each resultant structure was disposed on a lead frame 2a which was heated to 415° C. in advance, and was biased thereagainst, thereby melting the Sn-Cu alloy (the layer 5). Thereafter, the resultant structure was cooled and solidified on the frame 2a. For the purpose of comparison, a structure was prepared wherein a 600 Å thick V layer, a 2,500 Å thick Ni layer and a 1.5 μm thick Sn-Cu alloy layer (Cu: 50 atomic %) were sequentially deposited on the back surface of an npn small-signal transistor, and the resultant structure was attached to a lead frame in the same manner as in Examples 1 and 2. The collector-emitter saturation voltage $V_{CE}$ (sat.) and the Saturated forward voltage between base and collector ($V_{BCF}$) of the electrical characteristics of these semiconductor device were evaluated. The results are shown in Table 1.

Note that $V_{CE}$ (sat.) was measured at $I_C=100$ mA, and $I_B=10$ mA, and $V_{BCF}$ was measured at $I_B=300$ mA.

TABLE 1

|  | $V_{CE}$ (sat.) | $V_{BCF}$ |
|---|---|---|
| Example 1 | 162 mV | 1.08 V |
| Example 2 | 152 mV | 1.09 V |
| Comparative Example 1 | 250 mV | 1.30 V |

As is apparent from the above table, in Examples 1 and 2, $V_{CE}$ (sat.) sufficiently falls within an allowable range of 130 mV to 220 mV, and approximately overlaps a target value of 130 mV to 150 mV. $V_{BCF}$ achieves a target value of 1.1 V. In contrast to this, in Comparative Example 1, an adequate value cannot be obtained, and the device cannot be applied in practice.

In Example 2, only the thickness of the V layer was varied, and $V_{CE}$ (sat.) was measured. The results are shown in FIG. 4. As can be seen from FIG. 4, it was confirmed that appropriate $V_{CE}$ (sat.) can be obtained when the thickness of the V layer is set to be 2,000 Å or more. Note that in these Examples, when a V-Co (5 wt %) alloy layer was used in place of the V layer, the same effect could be obtained.

EXAMPLE 3

Figure 5:
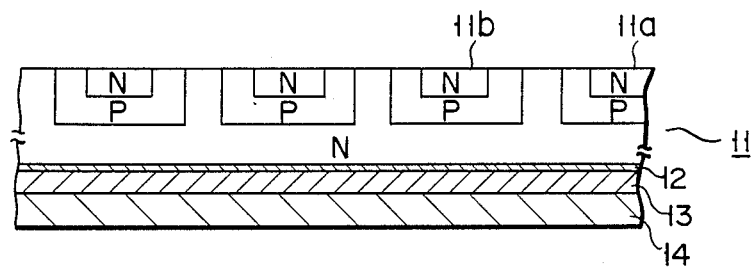
FIGS. 5 and 6 are sectional views showing an arrangement according to still another embodiment of the present invention.

As shown in FIG. 5, a V layer 12, a Ti layer 13 and an Sn-Cu (40 atom. %) layer 14 were sequentially deposited on a bottom surface of an Si substrate 11 on which a plurality of npn transistors 11a, 11b, . . . were formed. In this case, the V layer 12 had a thickness of 690 Å, the Ti layer 13 had a thickness of 2,700 Å and the Sn-Cu layer 14 had a thickness of 1.5 μm. Although not shown in FIG. 5, a 2,000 Å thick Au layer as an antioxidant layer was deposited on the surface of the Sn-Cu layer 14. Thereafter, the resultant structure was cut into transistor chips by a diamond scribe technique.

Figure 6:
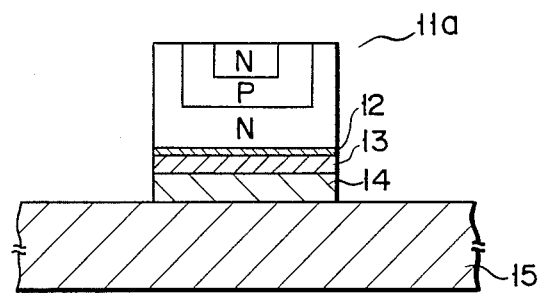

The transistor chip was attached to a Cu lead frame 15 at a temperature of 450° C., as shown in FIG. 6. The Sn-Cu layer 14 was melted by heating and biasing force and was solidified after cooling, thus fixing the chip to the lead frame 15.

EXAMPLE 4

In place of the Ti layer of Example 3, a 2,500 Å thick Cr layer was formed. Sn-Cu (44 atom. %) was used as a solder material. The transistor chip was bonded to the lead frame under the same conditions as in Example 3.

Figure 7:
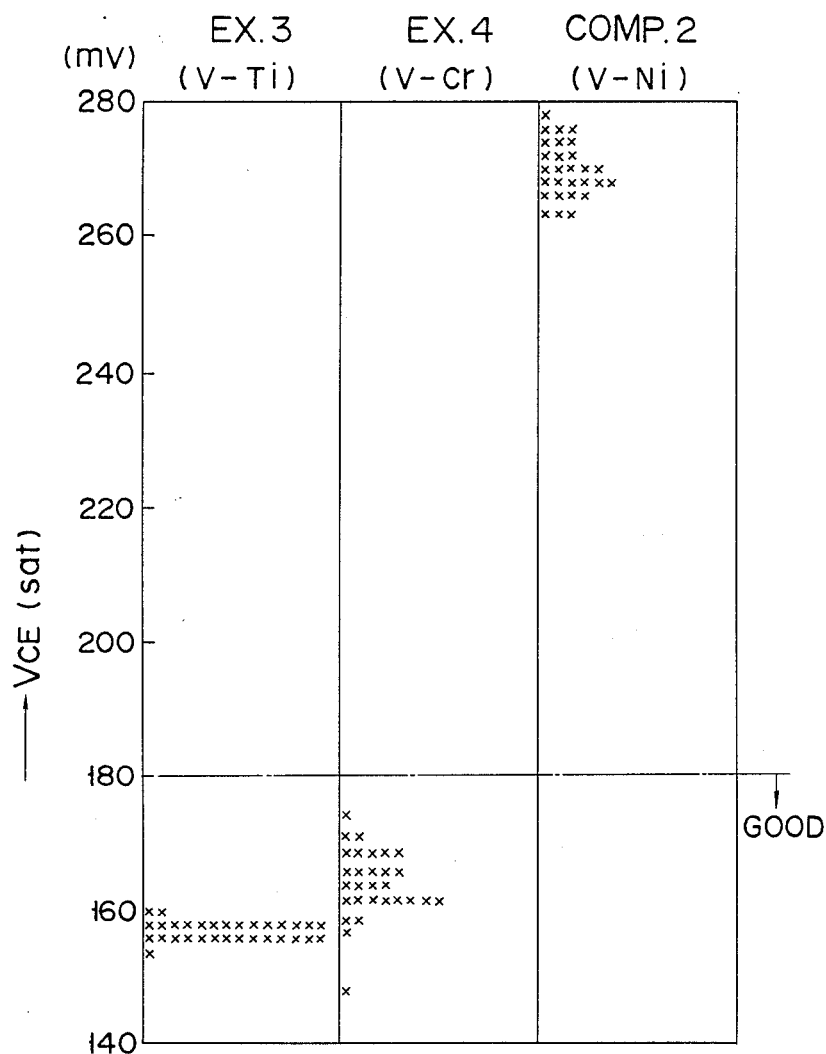
FIG. 7 is a diagram showing the electrical characteristics of the semiconductor device of the present invention in comparison with those of the prior art device.

FIG. 7 shows results of the $V_{CE}$ (sat.) test in Examples 3 and 4. Measurement conditions included $I_C$=100 mA and $I_B$=10 mA. For the purpose of comparison, FIG. 7 also shows data obtained when an Ni layer was provided between the V layer and the Sn-Cu layer. As is apparent from FIG. 7, in Comparative Example 2, $V_{CE}$ (sat.) is considerably high as compared to the required value 180 mV, while Examples 3 and 4 satisfy the requirement.

Abnormality was not found in the devices of Examples 3 and 4 in a solder heat resistance test at a temperature of 350° C. for 3 sec, and a sufficient resistance against a thermal shock could be provided. Furthermore, when a pressure cooker test (PCT) was conducted at a pressure of 2 atm. for 300 hours, degradation in electrical characteristics did not occur and the chip did not peel.

Therefore, as is clearly seen from these Examples, since the solder material is inexpensive and yield can be improved, this results in a considerable reduction in cost of a semiconductor device.

Although detailed data is not shown, it was confirmed that when Zr and Nb are used instead of Ti and Cr, or when an alloy containing these metals as major components is used, the same effect can be obtained.

EXAMPLES 5 and 6

Examples 5 and 6 correspond to the embodiment shown in FIG. 3. In Example 5, a 2,700 Å thick V layer as the first metal layer 4, a 1,500 Å thick Ni layer as the second metal layer 6 and a 2 μm thick Sn-Cu alloy solder material layer 5 (Cu: 60 atom. %) were sequentially deposited on the back surface of an npn small-signal transistor (as the semiconductor chip 1), and the resultant structure was bonded to a lead frame 2a. In Example 6, a 3,000 Å thick Ti layer as the first metal layer 4, a 1,500 Å thick Ni layer as the second metal layer 6 and a 1.5 μm thick Sn-Cu alloy solder material layer 5 (Cu: 60 atom. %) were sequentially deposited on the back surface of an npn small-signal transistor, and the resultant structure was bonded to another lead frame 2a.

For the purpose of comparison, a 1,000 Å thick V layer and a 2 μm thick Sn-Cu solder material layer (Cu: 60 atom. %) were sequentially stacked on the back surface of another npn small-signal transistor of the same type and the resultant structure was bonded to a lead frame (Comparative Example 3). Also, a 1,000 Å thick Ti layer and a 1.5 μm thick Sn-Cu solder material layer (Cu: 60 atom. %) were sequentially stacked on the back surface of another small-signal transistor of the same type and the resultant structure was bonded to a lead frame (Comparative Example 4).

As shown in Table 2, a thermal shock test (TST), a frame dry ice test (FDT) and a solder resistance test were conducted for these semiconductor devices. Note that the TST was carried out by repeating 10 cycles of the operation wherein the device was dipped in boiling water for 15 minutes and was exposed to an atmosphere at a temperature of −75° C. for 15 minutes. The FDT was conducted by repeating 10 cycles of the operation wherein the device was placed on a hot plate (200° C.) for 3 minutes and then was exposed to a dry ice-methyl alcohol mixture solution (−75° C.) for 3 minutes. The solder resistance test was conducted by examining the adhesion state of the solder to the wafer as follows. The silicon wafer on which first and second metal layers 4 and 6 and the solder material layer 5 were deposited was first dipped in a Pb-Sn eutectic solder (230° C.) to pick up a portion of the Pb-Sn entectic solder on the surface of the layer 5. After the Pb-Sn entectic solder on the wafer was cooled and solidified, the wafer was split into two. When the wafer remained at the side of the Pb-Sn entectic solder, an adhesion strength between the Sn-Cu and the silicon wafer was regarded sufficient, and the wafer was evaluated as a good wafer. However, when a wafer surface was peeled off, the adhesion strength was regarded insufficient and such a wafer was evaluated as a defective wafer.

The results of the above tests are as shown in Table 2, and respective values indicate the number of defective wafers (numerator) with respect to the total number of wafers tested (denominator).

TABLE 2

|  | TST | FDT | Solder Resistance Test |
|---|---|---|---|
| Example 5 | 0/30 | 0/25 | 0/20 |
| Example 6 | 0/30 | 0/25 | 0/20 |
| Comparative Example 3 | 1/30 | 2/25 | 1/20 |
| Comparative Example 4 | 1/30 | 3/25 | 3/20 |

As is apparent from Table 2, in Examples 5 and 6, no defective wafer was found in the TST, and it was confirmed that the reliability thereof is superior to the Comparative Examples. As for the electrical characteristics, it was confirmed that wafers according to Examples 5 and 6 can provide smaller $V_{CE}$ (sat.) than that according to Comparative Examples.

According to the present invention, a semiconductor device which has excellent electrical characteristics and high reliability can be obtained by Sn-Cu soldering.

Note that the data are presented when V is used for the first metal layer 4 and Ti is used for the second metal layer 6. However, the present invention is effective when an alloy of these metals is used. It was confirmed that the same effect can be obtained when V, Cr, Zr, Nb or an alloy thereof is used for the first metal layer 4 and when Co or an alloy thereof is used for the second metal layer 6.

According to the present invention, since Ti and the like effectively serve as a barrier with respect to Cu diffusion as compared to a conventional Ni layer, element characteristics will not be degraded. Poor contact or peeling does not easily occur in an acceleration test or a thermal shock test, and a highly reliable semiconductor device can thus be provided. In addition, since a solder material is inexpensive, a semiconductor device can be manufactured at low cost.

What is claimed is:

1. A semiconductor device in which a semiconductor chip is fixed to a base by a solder material layer made of an alloy containing tin and copper, wherein
   a first metal layer consisting of a member selected from the group consisting of titanium, chromium, vanadium, zirconium, niobium, and an alloy containing not less than 75 atomic % of at least one thereof is interposed between said solder material and said semiconductor chip so as to have a thickness falling within a range between 2,000 Å to 3 μm.

2. A device according to claim 1, wherein said first metal layer consists of a metal selected from the group consisting of titanium, chromium and vanadium.

3. A device according to claim 1, wherein said first metal layer contains not less than 75 atomic % of a metal selected from the group consisting of titanium, chromium and vanadium.

4. A device according to claim 1, wherein a thickness of said first metal layer falls within a range between 2,300 Å and 1 μm.

5. A device according to claim 1, wherein said solder material layer further contains not more than 53 atomic % of zinc based upon a content of copper.

6. A device according to claim 1, wherein said solder material layer further contains not more than 25 atomic % of aluminum based upon a content of copper.

7. A device according to claim 1, wherein said solder material layer contains 13.3 to 75 atomic % of copper.

8. A device according to claim 1, wherein a second metal layer consisting of a member selected from the group consisting of nickel, cobalt and an alloy containing not less than 75 atomic % of at least one thereof is interposed between said first metal layer and said solder material layer so as to be thinner than said first metal layer.

9. A device according to claim 1, wherein said first metal layer further contains not more than 20 atomic % of at least one element selected from the group consisting of phosphorus and boron.

10. A device according to claim 1, wherein the thickness of said solder material falls within a range between 0.5 μm and 5 μm.

11. A device according to claim 1, wherein an antioxidant layer made of gold is interposed between said solder material layer and the base.

12. A device according to claim 11, wherein the thickness of said gold layer falls within a range between 500 and 3,000 Å.

13. A device according to claim 1, wherein said first metal layer comprises a plurality of layers.

14. A device according to claim 1, wherein said second metal layer further contains not more than 20 atomic % of at least one element selected from the group consisting of phosphorus and boron.

* * * * *